(12) United States Patent
Lerner

(10) Patent No.: US 8,247,884 B2
(45) Date of Patent: Aug. 21, 2012

(54) SEMICONDUCTOR STRUCTURE FOR FABRICATING A HANDLE WAFER CONTACT IN A TRENCH INSULATED SOI DISC

(75) Inventor: Ralf Lerner, Erfurt (DE)

(73) Assignee: X-Fab Semiconductor Foundries AG, Erfurt (DE)

( * ) Notice: Subject to any disclaimer, the term of this patent is extended or adjusted under 35 U.S.C. 154(b) by 323 days.

(21) Appl. No.: 12/666,880

(22) PCT Filed: Jun. 27, 2008

(86) PCT No.: PCT/EP2008/058292
§ 371 (c)(1),
(2), (4) Date: May 20, 2010

(87) PCT Pub. No.: WO2009/000921
PCT Pub. Date: Dec. 31, 2008

(65) Prior Publication Data
US 2010/0308432 A1   Dec. 9, 2010

(30) Foreign Application Priority Data
Jun. 27, 2007   (DE) .......................... 10 2007 029 756

(51) Int. Cl.
*H01L 21/70* (2006.01)
(52) U.S. Cl. . 257/520; 257/510; 257/513; 257/E21.545; 257/E29.006; 438/433
(58) Field of Classification Search .................. 257/510, 257/513, 520, 505–506, E21.551, E29.006, 257/E21.545; 438/433
See application file for complete search history.

(56) References Cited

U.S. PATENT DOCUMENTS

| | | | | |
|---|---|---|---|---|
| 4,272,776 A | * | 6/1981 | Weijland et al. | 257/511 |
| 4,894,702 A | * | 1/1990 | Maas et al. | 257/588 |
| 5,200,354 A | * | 4/1993 | Om et al. | 438/243 |
| 5,221,856 A | * | 6/1993 | Dekker et al. | 257/518 |
| 5,241,210 A | * | 8/1993 | Nakagawa et al. | 257/487 |
| 5,314,841 A | | 5/1994 | Brady et al. | |
| 5,360,758 A | * | 11/1994 | Bronner et al. | 438/243 |
| 5,854,500 A | * | 12/1998 | Krautschneider | 257/300 |
| 5,945,712 A | | 8/1999 | Kim | |

(Continued)

FOREIGN PATENT DOCUMENTS
DE   41 27 925 A1   2/1993
(Continued)

OTHER PUBLICATIONS

International Search Report for PCT/EP2008/058292 mailed Dec. 30, 2008, 3 pages.

(Continued)

*Primary Examiner* — N Drew Richards
*Assistant Examiner* — Ankush Singh
(74) *Attorney, Agent, or Firm* — Hunton & Williams LLP

(57) ABSTRACT

Disclosed is a semiconductor structure for producing a handle wafer contact in trench insulated SOI discs which may be used as a deep contact (7, 6, 30') to the handle wafer (1) of a thick SOI disc as well as for a trench insulation (40). Therein, the same method steps are used for both structures which are used as deep contact to the handle wafer of the thick SOI disc as well as trench insulation.

29 Claims, 3 Drawing Sheets

U.S. PATENT DOCUMENTS

| | | | |
|---|---|---|---|
| 6,037,620 A * | 3/2000 | Hoenigschmid et al. | 257/296 |
| 6,063,657 A * | 5/2000 | Bronner et al. | 438/244 |
| 6,121,668 A * | 9/2000 | Soderbarg et al. | 257/510 |
| 6,300,666 B1 | 10/2001 | Fechner et al. | |
| 6,323,082 B1 * | 11/2001 | Furukawa et al. | 438/247 |
| 6,348,363 B1 | 2/2002 | Chung et al. | |
| 6,439,514 B1 * | 8/2002 | Yamaguchi et al. | 257/500 |
| 6,521,947 B1 | 2/2003 | Ajmera et al. | |
| 6,617,661 B2 * | 9/2003 | Michel et al. | 257/502 |
| 6,649,964 B2 | 11/2003 | Kim | |
| 6,677,657 B2 * | 1/2004 | Gardes | 257/488 |
| 6,794,716 B2 | 9/2004 | Park et al. | |
| 6,943,396 B2 * | 9/2005 | McNeil | 257/302 |
| 7,012,313 B2 * | 3/2006 | Heineck et al. | 257/413 |
| 2002/0163041 A1 | 11/2002 | Kim | |
| 2003/0057485 A1 | 3/2003 | Gardes | |
| 2005/0253218 A1 * | 11/2005 | Jeon et al. | 257/500 |
| 2006/0255406 A1 | 11/2006 | Ichijo et al. | |
| 2008/0315346 A1 * | 12/2008 | Lerner et al. | 257/501 |
| 2009/0294893 A1 * | 12/2009 | Lerner et al. | 257/506 |

FOREIGN PATENT DOCUMENTS

| | | |
|---|---|---|
| DE | 10 2005 010 944 A1 | 9/2006 |
| EP | 0 596 264 A1 | 5/1994 |
| EP | 1 083 607 A2 | 3/2001 |

OTHER PUBLICATIONS

Office Action from the German Patent and Trademark Office mailed Mar. 4, 2008, 3 pages. (German Language).

* cited by examiner

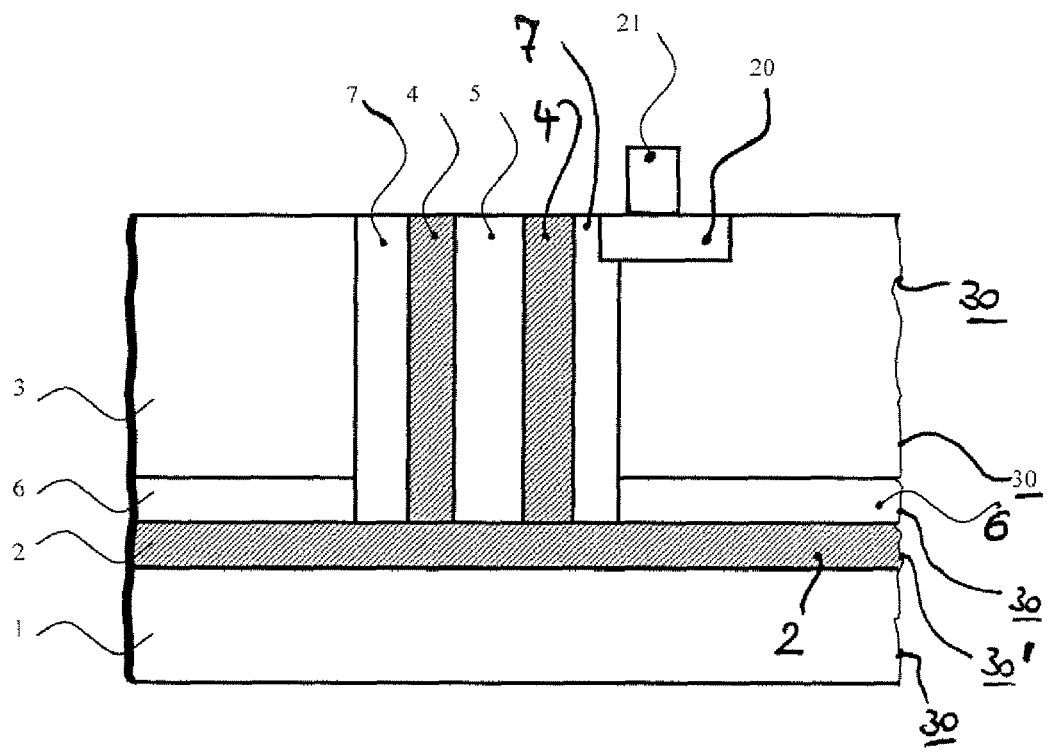
Fig. 3a
Fig. 3b
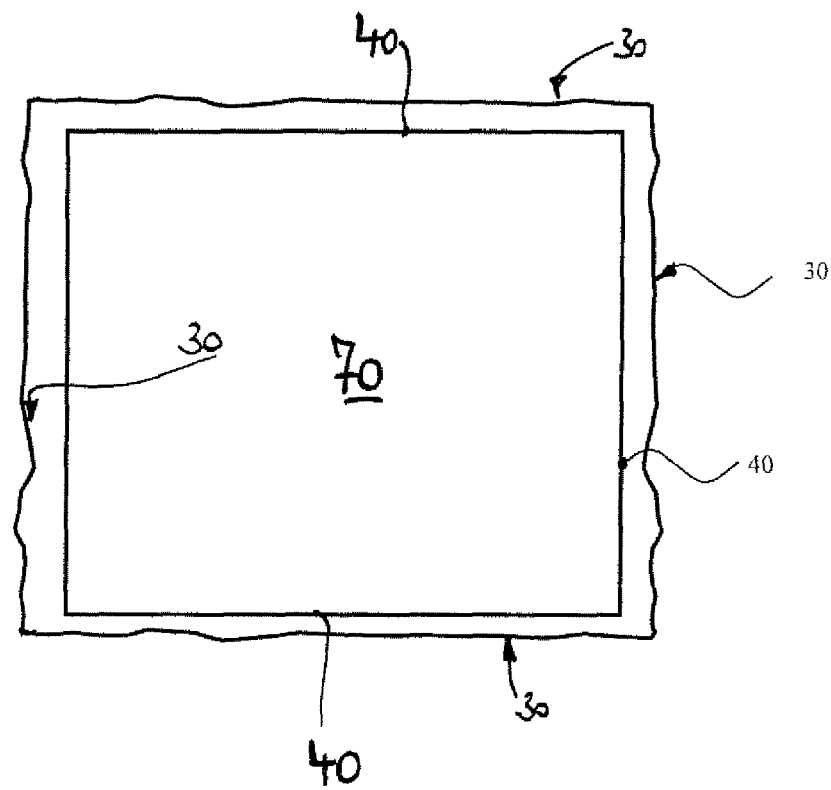

SEMICONDUCTOR STRUCTURE FOR FABRICATING A HANDLE WAFER CONTACT IN A TRENCH INSULATED SOI DISC

CROSS-REFERENCE TO RELATED APPLICATIONS

The application is a U.S. National Stage Application of International Application of PCT/EP2008/058292 filed Jun. 27, 2008, which claims the benefit of German Patent Application No. 10 2007 029 756.6 filed Jun. 27, 2007, the disclosures of which are herein incorporated by reference in their entirety.

FIELD OF THE DISCLOSURE

The invention relates to a semiconductor structure for fabricating a handle wafer contact in trench insulated, thick SOI discs. In SOI (silicon on insulator) discs, the handle disc ("handle wafer") is normally electrically insulated from the electrically active disc ("device wafer"). Without an electrical contact to the handle disc, the handle disc is "floating" with respect to the active disc. It may be on a unsteady or undefined electrical potential, and influence thereby in a disadvantageous way the electrical function of the integrated circuits on the upper side of the active disc. Examples are the so-called "floating body effect" or the "back gate effect".

BACKGROUND OF THE DISCLOSURE

In order to be able to put the handle wafer to a fixed electrical potential, an electrical contact is desired (an electrically conducting connection). This can be affected from the back side of the disc for example. However, the implementation requires an electrically conducting backside contact with which the disc fabrication as well as the mounting process (assembly) would become remarkably more complex.

Out of this reason, it is advantageous that an electrically conducting contact is realized starting from the front side.

In order to be able to utilize the advantage of the dielectric insulation of the SOI disc, among others for integrated smart power circuits in which different sections of the circuit are in part on remarkably different voltages (for example ground and 600V), also insulation structures are, however, required which electrically insulate the different sections of the circuit electrically from each other. Therein, a trench insulation is used frequently, in particular in technologies which use thick (for example 50 µm) SOI discs.

In the U.S. Pat. No. 5,314,841, a method is described in which a trench is etched through the active disc and through the buried oxide. The opened up surface in the handle disc is doped during the source/drain-implantation and is contacted by means of the normal metallization.

A similar structure is disclosed in the U.S. Pat. No. 5,945,712. The thin active silicon and the buried oxide (called insulation layer) are etched through and are contacted during the normal IC metallization.

A similar case is to be read in the U.S. Pat. No. 6,300,666. Also there, the thin active silicon and the buried oxide are etched through. The exposed area in the carrier wafer is doped by an implantation. The carrier wafer is electrically connected by means of the normal IC metallization by means of the normal silicidation/metallization, These methods can only be applied to very shallow insulation trenches ("shallow trench insulation" in thin film SOI techniques). With ratios of depth to breadth of 10:1 and larger, no contacting of the carrier disc can be achieved in this way.

In the known structures and methods, also the metallization within the trench is disadvantageous whereby no further high temperature processes above 400° C. are possible. It is, however, an essential point that a simultaneous production of the trench insulation and of a contact to the carrier disc is not possible with such structures and methods.

In the U.S. Pat. No. 6,794,716 B2, a method or a structure, respectively, is described wherein a trench which reaches until below the buried oxide, is filled with "metal" and tungsten and, in this way, a contact region in the handle wafer is conductively connected to a part of the active layer ("body" of the transistor), but, however, only a portion of the layer.

The following method is disclosed in the U.S. Pat. No. 6,649,964: Trenches having differing breadths are etched into a SOI disc. The trenches are, therein, deeper than the buried oxide and, so to speak, "penetrate through" those. Thereafter, a semiconductor layer, poly silicon or amorphous silicon are deposited and are doped by oblige implantation. By means of an anisotropic etching, a so-called spacer out of doped silicon is generated at the sidewall of the trench which extents from the upper surface of the SPO-disc into the handle wafer. Thereafter, a metallization is input and structured in some trenches, i.e. at least one further photo resist mask is required besides the structuring of the trenches. The trenches are filled by depositing silicone oxide, and the disc is planarized by means of a CMP process. This method has the following disadvantages. At least two structuring steps are required. Because of the completed metallization, no further high temperature processes can be carried out subsequently to this method. The handle disc is permanently connected to the active disc by the doped spacer, however, a contacting insulated from the active silicon disc of the handle disc is, thereby, not possible. In the described structure, all areas of the active layer are connected to the handle disc and, thereby, short circuited.

In the U.S. Pat. No. 6,521,947 structures or a method, respectively, is/are described wherein, at first, shallow insulation trenches ("shallow trench insulation") are etched. As a result, silicone islands are produced which are isolated from each other and covered by nitride. Subsequently, an oxide layer is deposited. In areas to the side of silicone islands, a trench by means of a pure oxide etching is generated which trench extents through the deposited oxide layer and through buried oxide of the SOI disc. The trench which reaches through the oxide and ends at the substrate, is, thereafter, filled up by poly silicon. In this way, a structure has been produced in which insulation trenches as well as contacts to the handle disc are contained. However, this structure has the disadvantage that, for producing them, a method has to be used in which two different structuring steps and two different etching steps have to be used for the insulation trenches and the contact. On the one hand, this means effort and, on the other hand, this means that this structure cannot be used in this way for deep insulation trenches having a typical depth of 50 µm.

In the DE-A 10 20005 010 944, a method is described in which deep insulation trenches and deep contact trenches can be manufactured at the same time. Therein, trenches having differing breadth are etched at first. In a subsequent filling step, narrow trenches are completely filled up, broad trenches, however, only in part. The partially affected filling of the broad trenches serves, thereafter, as a mask for etching the buried oxide layer. By means of a filling with conductive material, for example by doped poly silicon, the handle disc can be electrically contacted from the upper surface of the disc. It is, however, disadvantage with this method that, as compared to the fabrication of insulation trenches, further process steps are required: etching of the buried layer and a second filling with conductive poly silicon.

The invention is based on the objective to utilize process steps available in the technology, for contacting the handle disc without additional effort in the method for fabricating the contacting.

SUMMARY OF THE DISCLOSURE

This objective is achieved by means of the features stated in the claim 1, 9 or 14 or 26. Respective advantageous embodiments are stated in the dependent claims as far as they are referenced to one of the independent claims.

In the teaching of the invention, on the basis of the processes required for producing a circuit, a contact scheme is provided which allows a connection from the handle disc to the front side, i.e. to the active disc, without additional processes being required therefore. For this purpose, a highly doped contact region is produced which can be carried out within the drain and source implantation. The contact region is in (conductive) connection with the active disc through a (high) doped sidewall area of an edge insulation trench. In order to obtain a conductive connection between the handle disc and the active disc (area) after the sawing step, for example through the lateral surface modified by the sawing of the buried oxide and/or through a conductive bonding layer in form of solder or adhesive, the highly doped contact region at the side of the insulation trench facing the sawing edge, is provided as a sawing ridge.

In this way, after singularization of the chips by sawing, a conductive connection between the handle disc and the highly doped contact region is generated which, itself, can be suitably contacted during the metallization.

It is possible in this way, to produce a connection to the bonding pad or to reach the contact region through the circuit within the chip. Accordingly, it is possible according to invention to realize an electrical contact (conductor connection) to the handle disc without further processing steps (without an additional effort in the fabrication process). If required, the contact enables putting the handle disc to a defined voltage from the front side thereof. An additional contacting of the back side through the housing during the mounting process of the chip is not required.

Therefore, it is possible with the invention, to provide a structure for contacting the handle disc in trench insulated SOI discs which may be produced with low effort and may be used universally and which results in an improvement of the yield and the reliability.

The semiconductor structure (claim 1) which comprises insulating trenches having a doped sidewall region as well as contact regions and a metallization contact, can be implemented in a semiconductor chip or is a general section of this semiconductor chip, respectively, which comprises, furthermore, the sawing edge as sawing ridge which is disturbed with respect to its crystallography and, therefore, at least partly electrically conductive, for forming a high-ohmic connection passed the insulation layer or through the lateral surface thereof, respectively, which corresponds to the (low) height of this layer. If, out of this reason, one talks about a sawing ridge, this has to be seen in relation to the breadth or the surface area of the wafer or the sawn chip. The ridge itself is only the upper edge, sawing through the chip results in a sawing ridge which, however, is defined by the sawing edge (claim 9).

A peripheral sawing ridge or a peripheral sawing edge, respectively, results in an adjacent, inner, peripheral insulation trench and an inner (not inside but within in the lateral direction) the insulation trench arranged chip surface or chip area which contains the circuits in the active disc or the active region. Therein, also the above mentioned contact region and the above mentioned metallization contact, preferably also a further metallic conductor path, can be placed.

As to the term of the "high" doping, it is to be said, depending on the technology, that it should be understood to be oriented on the function. The sidewall area is doped to such an extent that it fulfils its task. The contact region is, depending on the technology—(highly) doped to such an extent that it fulfils its task, and the buried layer above the insulated layer is (highly) doped such that it fulfils its task, each with reference to the provision of a contact (a conductor path) from the front side thereof completely through the layers to the back side. Examples of doping are proposed (claims 22 to 25).

The buried (highly) doped layer which is provided above or on the insulating layer, has the same doping type as the active area or the active disc, respectively. The doping is type corresponds to the conduction type (claim 2).

The characterization of the conductive connection with low-ohmic And high-ohmic connections is self explaining for the knowledgeable reader. An insulating layer which is disturbed with respect to crystallography at its surface and is, thereby, at least somewhat conductive, for example connecting in a "high-ohmic" way, is not an insulator anymore but "bridges" the insulator and the understanding of the feature high-ohmig is to be seen in that at least a low conductivity is generated. A very low-ohmic connection which provides an additional electrically conductive layer (claim 19) past the rough surface caused by sawing and next to this surface which is crystallographically disturbed (claim 9), is essentially lower in its ohmic resistance than the surface disturbed crystallographically. It is not an ideal metallic conductor but a pronouncedly better conductor than the high-ohmic connection only through the mentioned side surface. For the purpose of the potential equalization and for avoiding floating, a connection is sufficient which is at least somewhat conductive since no essential currents are moved across this connection, but anyway only a (long term) voltage or potential equalization is to be provided by draining charges such that a long term change of the potential difference can be avoided.

The circuits which are arranged in the chip area, are not shown separately. Devices of such circuit arrangements are mentioned, for example transistors, capacitors, resisters and the like, as well as power elements and other source/drain containing devices. These are not shown in the Figures, and they are considered to be generated symbolically as produced in the chip area by usual processes, for example normal MOS processes.

Advantageous embodiments of the subject-matter of claim 14 are stated in the dependent claims 15 and following. The semiconductor structure (claim 26) may have an interrupted (highly) doped layer above the insulation layer which, anyway, is "continuous over the whole disc" even if it is interrupted at the trenches (claim 27).

Another focal point is the semiconductor structure for producing a handle disc contact in a trench insulated SOI disc (claim 26). The handle disc is electrically insulated from the active disc by means of a buried oxide, and in the lower area of the active disc, there is a buried, highly doped layer practically reaching through the whole of the disc of the same doping type as the active disc.

The trench (as insulating trench) possesses (highly) doped sidewall areas having the same conductivity type as the active silicon disc, on which insulating layers at the sidewalls of the insulation trench and a filling layer are present. Outside of the part of the insulating trench lying towards the edge of the chip, the area of the sidewall doping and the surface is extended by a (highly) doped contact region on which there is a metallic, electrical contact. By means of the contact connection, an electrical contact (conductor path) is provided to the buried, highly doped layer. After the mechanical singularization of the chip or a separation by material removal might like sawing, respectively, an (electrically conductive) bridge is formed between the handle disc and the active disc.

The invention is explained with reference to embodiments with the aid of the schematic drawings.

BRIEF DESCRIPTION OF THE DRAWINGS

FIG. 3*a* shows the trench section with the example of the handle disc contact across the buried insulating layer 2 which is disturbed at its surface through a region 30' of the sawing edge as sawing ridge 30.

FIG. 3*b* is a top view of a sawn IC having a peripheral insulation trench 40 and a sawing edge or ridge 30 along all sides.

DETAILED DESCRIPTION OF EXEMPLARY EMBODIMENTS

Figure 1:
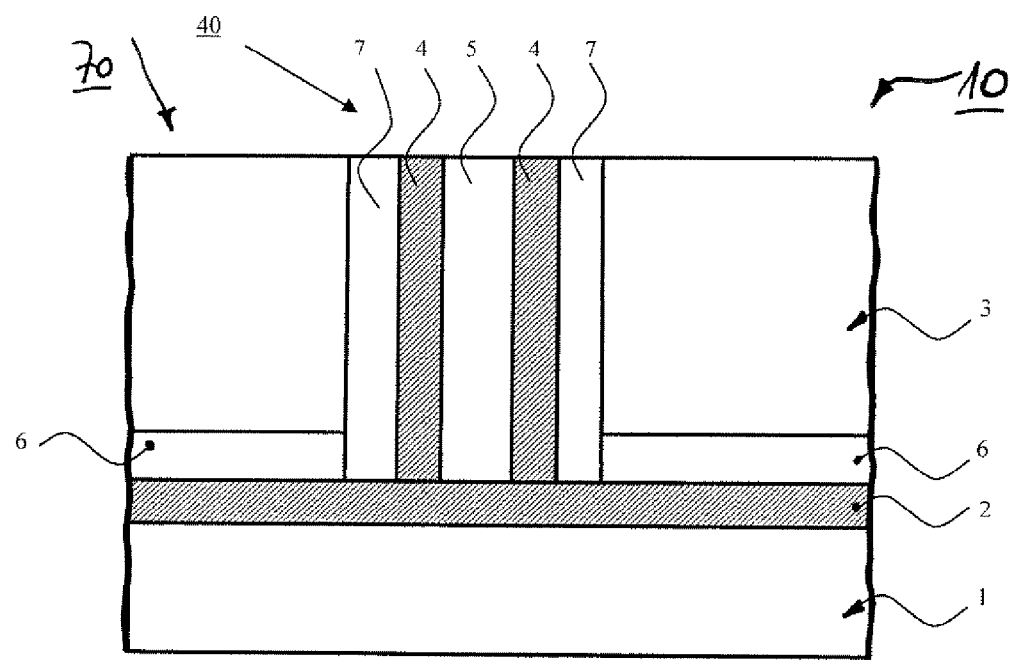
FIG. 1 shows the section of an insulation trench 40.

FIG. 1 shows a SOI disc 10 in which the handle disc 1 as a substrate is electrically insulated from the active disc 3 or the active area 3 by means of a buried insulation layer 2, for example a buried oxide.

In the lower area of the active disc 3, there is a buried, highly doped layer 6 of the same doping type as the active disc or the active area 3. After the etching of the insulation trenches, to which also a trench 40 belongs located at an edge of the chip area 70, as is explained more detailed in the following, the sidewalls are doped and form a highly doped sidewall layer 7 as an area of the same conduction type as the active silicon disc 3. The etching of the trench 40 typically is affected down to the buried insulation layer 2 such that also the highly doped, buried layer 6 is interrupted by the insulation trench, for example the trench 40. The insulation trench 40 consists out of an insulating layer 4, for example silicon dioxide, at the sidewalls 7 of the trench and a filling layer 5 each which, for example, may be poly silicon. Preferably, the arrangement is symmetric.

Figure 2:
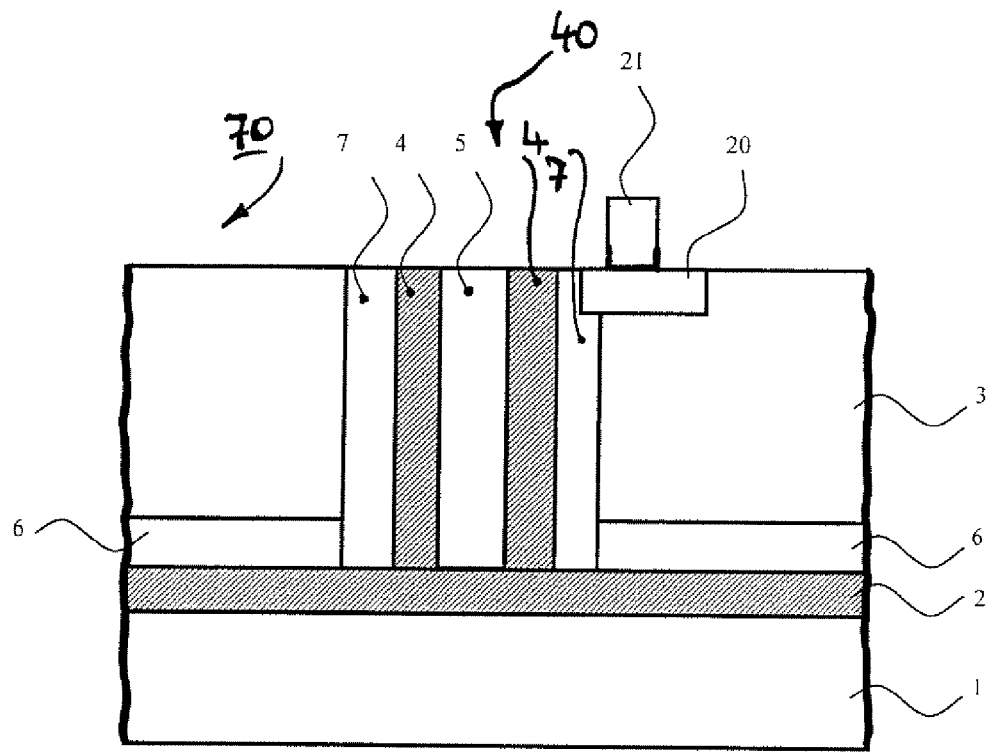
FIG. 2 a trench section with an example of the inventive structure of the handle disc contact.

In FIG. 2, an advanced stage of the process is shown. The usually highly doped source/drain implantation normally present in MOS processes, is used for the purpose to enlarge the area of the sidewall doping 7 at the surface by a highly doped contact region 20 outside of the outermost insulation trench 40, as is shown in FIG. 2. Thereby, by means of further process steps, contact formation and metallization—not shown in detail—, (the fabrication of contacts to devices, for example transistors, capacitors, resisters and the like) in the chip area 70 within the trench 40 (to the left thereof) as well as a fabrication of a metallization system by means of known metallization processes, an electric contact connection 21 to the active disc 3 can be produced outside of the trench 40, for example to the buried, highly doped layer 60.

FIGS. 3*a* and 3*b* show a cross sectional view and a top view, respectively of the "SOI disc" after the singularization such that single chips are produced. Upon singularization, the chip areas 70 or the edges 30 (as sawing edges) at the side of the later on the silicon chip are generated which have a certain surface roughness. The mechanical destruction of the atomic SiO$_2$structure of the buried insulation layer 2 at the cutting surface 30' or at the side surface of the IC, respectively, causes a large reduction of the insulation properties of the silicon dioxide. Thereby, a (slightly) conductive connection (L) is formed between the highly doped contact area 20 on the front side of the IC or the chip areas 70 and the corresponding part of the handle disc 1. In the embodiment shown, all of the IC 70 is surrounded by a peripheral insulating trench 40 such that the contacting of the handle disc 1 or the part belonging to the IC 70, respectively, is affected through the rough surface 30' of the buried insulation layer 2 also across all of the periphery of the IC 70. The relatively high-ohmic connection between the partial portion of the handle disc 10 corresponding to the IC 70 and the partial portion of the active disc 30 which lies outside of the trench 40, wherein, in the shown embodiment, the connection through the portion of the (highly) doped, buried layer 60 lying outside of the trench 40 is affected—can be compensated to a certain degree thereby, and a contact with higher conductivity is generated.

Figure 4:
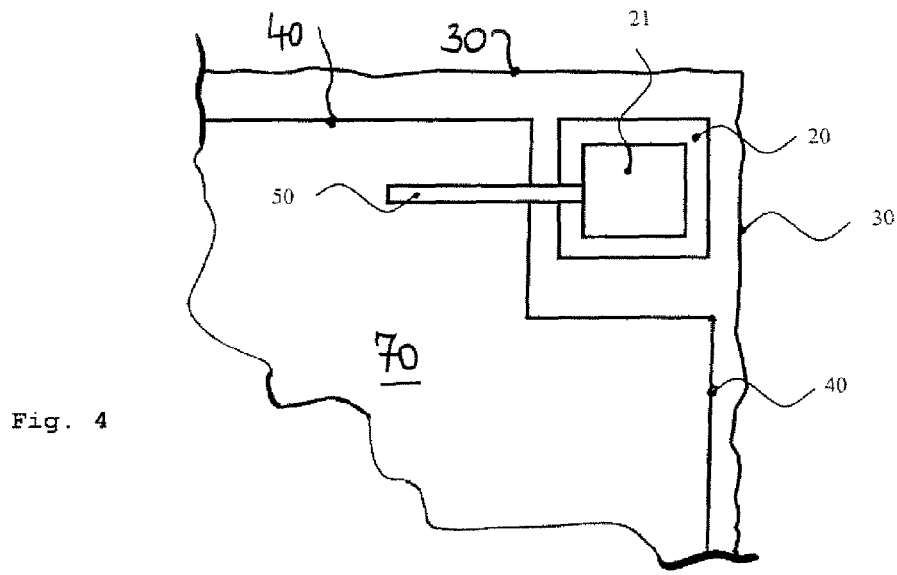
FIG. 4 is a top view of a part of the example of the inventive handle disc contact on the upper side of a IC.
Figure 5:
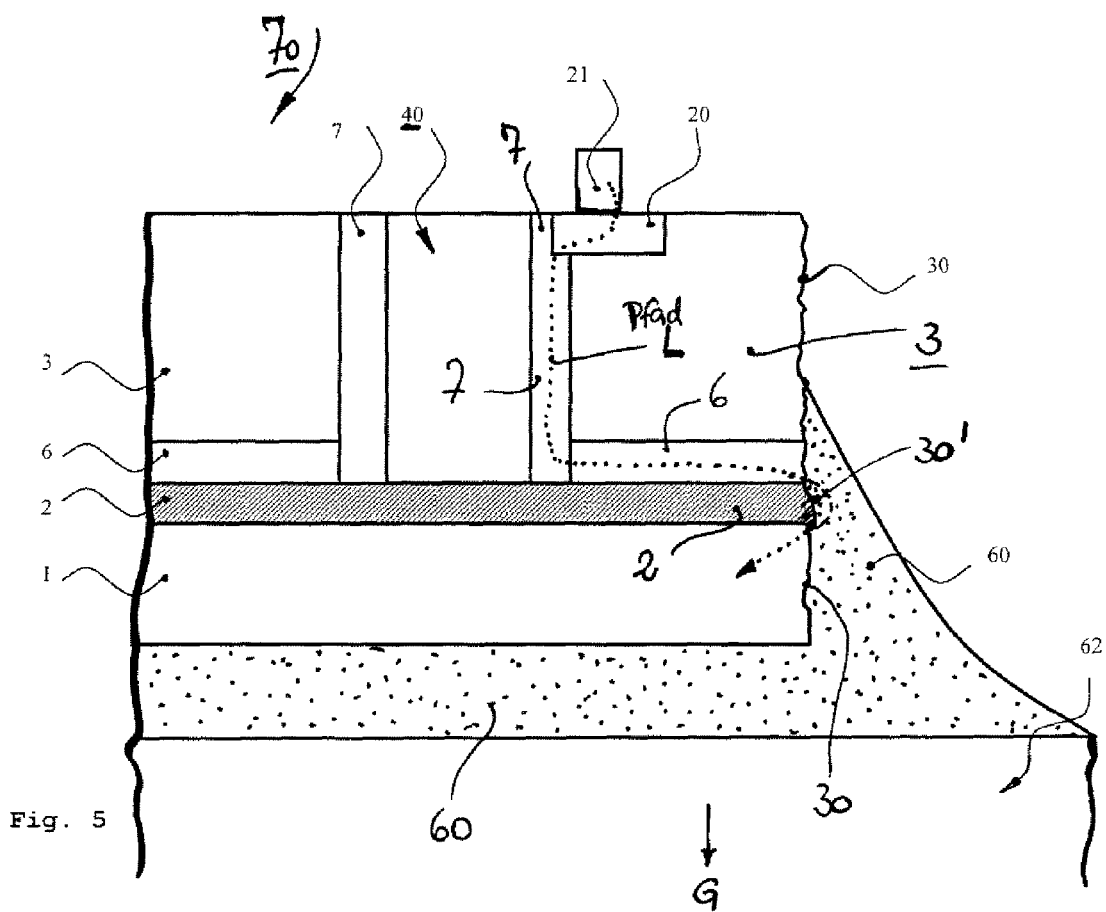
FIG. 5 is a trench section with the example of the inventive structure of the handle disc contact and the related contact bridge.

FIG. 4 shows the semiconductor structure in a further embodiment in which a contact having a highly doped contact region 20, the electrical contact 21 and the metal conductor path 50 is provided outside of the peripheral insulation trench 40, for example in a corner. In this case, the handle disc 1, i.e. the partial portion thereof corresponding to the IC 70, can be connected from the IC front side. Therein, the conductor path 50 can lead to one of the bond pads (not shown) of the IC 70, can, however, also be accessed through the IC 70 itself.

in FIG. 5, a possible modification of the embodiment is shown, The singularized IC 70 with the respective sawing ridge 30 as sawing edge is glued or soldered to a carrier plate 62 of the housing by means of a fixing layer 60. A further reduction of the electrical resistance between the handle disc 1, i.e. the partial portion corresponding to the IC 70 and the front side contact 30 can be reached in that the fixing layer 60 is formed out of a conductive fixing mass, for example out of conductive adhesive material or solder, and is extended across the buried insulation layer 2. Thereby, across the path L: conductive fixing mass 60, buried (highly) doped layer 6, sidewall doping 7, contact region 20 and metallization contact 21, the partial portion to the IC 70 of the handle disc 1 can be connected (very) in a low-ohmic way from the front side. The path runs further to the conductive layer 60 as is shown by a broken line next to the high-ohmic, sawn surface portion 30' of the layer 2.

Furthermore, the carrier plate 62 of the housing can be connected from the front side of the IC, thereby. The plate 62 may be mounted on a housing G which is not shown in more detail.

In an advantageous embodiment, edges or ridges 30 are generated at the narrow side of the subsequent silicon chip which have a certain surface roughness, see FIGS. 3 and 5, upon singularization of the ICs by means of the "machining", for example sawing, process. The mechanical destruction of the atomic SiO$_2$ structure at the cutting surface are at the side surface of the IC, respectively, causes a high reduction of the insulation properties of the silicon dioxide. Thereby, a (low) conductive connection is generated between the highly doped contact area 20 of the front side of the IC and the handle disc 2 (called a "bridge").

If the complete IC is surrounded by the peripheral insulation trench 40, the contacting of the handle disc is affected through the rough surface of the buried insulation layer 2 also across the complete circumference. The relatively high-ohmic connection between the handle disc 1 and he buried, doped layer 6 can be compensated thereby, and a contact with an improved conductivity is generated.

In case one forms a contact consisting out of a highly doped contact region 20, the electrical contact 21 and the metal conductor path 50 outside of the peripheral insulation trench 40, for example in a corner, as shown in FIG. 4, the handle disc 1 can be connected from the front side of the IC. Therein, the conductor path 50 may lead to one of the bond pads of the IC, it can, however, also be controlled by the IC itself. Furthermore, the carrier plate 62 of the housing can be connected from the front side of the IC thereby.

An advantageous embodiment relates to a semiconductor structure for producing a handle disc contact in a trench insulated SOI disc in which the handle disc 1 is electrically insulated from the active disc 3 by means of a buried oxide 2, and wherein the lower area of the active disc 3 a buried, (highly) doped layer 6 interrupted in the area of the insulation trench and having the same doping type as the active disc 3. The trench possesses the highly doped sidewall areas 7 with the same conductivity type as the active silicon disc 3, on which there are the insulation layers 4 at the sidewalls of the trench and the filling layer 5, whereby the area of the sidewall doping 7 at the surface outside of the part of the insulation trench located towards the edge of the chip by a highly doped contact region 20 on which there is the metallic electrical contact 21 through which an electrical contact to the buried, (highly) doped layer 6 is given and where in an electrical bridge are a connection between the handle disc 1 and the active disc 3 is present after the mechanical singularization of the chip.

An advantageous embodiment refers to above mentioned semiconductor structure in which the highly doped contact region 30 is doped by source/drain implantation usually present in normal MOS processes.

A further advantageous embodiment refers to the above mentioned semiconductor structure, in particular in a semiconductor chip, in which the handle disc is connected (very) low-ohmically along the path L from the front side to the conductive fixing layer 60 extended across the buried insulation layer 2.

REFERENCE NUMBERS

1: handle disc of the SOI disc, "handle wafer"
2: buried insulation layer, for example $SiO_2$, "buried oxide"
3: active silicon layer "device wafer"
4: insulation layer, for example $SiO_2$ at the sidewall of the trench
5: filling layer, for example poly silicon
6: buried (highly) doped layer
7: sidewall doping of the insulation trench
10: SOI disc with semiconductor structure
20: highly doped area by means of source/drain implantation (contact region)
21: metallization (contact connection)
30: sawing edge (for defining the sawing ridge)
40: (peripheral) insulation trench
50: metallization path
60: conductive adhesive material or solder
62: carrier plate
70: chip area with circuit or IC (integrated circuit), respectively

The invention claimed is:

1. A semiconductor structure of a SOI disc having a handle disc and an active disc that are separated or spaced from each other by a buried insulation layer, comprising:
    an insulation trench located at an edge of a chip area of the active disc and extending to the buried insulation layer, and comprising at least a doped sidewall area having a same conductivity type as the active disc and arranged with at least at one side facing away from the chip area;
    a doped contact region that is in connection with the doped sidewall area;
    a metallization connection that is connected to the doped contact region.

2. The semiconductor structure according to claim 1, wherein a doped buried layer is provided on the buried insulation layer and having the conductivity type of the active disc or the same doping type as the active disc.

3. The semiconductor structure according to claim 1, wherein the insulation trench comprises at least an insulation layer adjacent to the doped sidewall area.

4. The semiconductor structure according to claim 1, further comprising a metallic conductor path which is connected to a bond pad arranged in the chip area.

5. The semiconductor structure according to claim 1, further comprising a metallic conductor path which is electrically conductively connected to an electrical node of a circuit in the chip area for controlling the metallization contact through the circuit.

6. The semiconductor structure according to claim 1, wherein the insulation trench completely surrounds the chip area.

7. The semiconductor structure according to claim 1, wherein the insulation trench comprises poly silicon as a filling material.

8. The semiconductor structure having a semiconductor structure according to claim 1 and comprising:
    a sawing edge as a sawing ridge being disturbed at the surface with view to crystallography, which ridge is facing the sidewall area of the insulation trench and forms a high-ohmic connection between the handle disc and the active disc.

9. The semiconductor structure according to claim 1, wherein a doping level of the sidewall area is larger than $10^{16}$ per $cm^3$, the contact region doping is more than $10^{18}$ per $cm^3$.

10. The semiconductor structure of claim 2, wherein the doping level of the buried layer is more than $10^{17}$ per $cm^3$.

11. The semiconductor structure according to claim 1, wherein the insulation trench is substantially at least 50μm deep.

12. The semiconductor structure according to claim 1, wherein the ratio of depth to breadth of the insulation trench is larger than 10.

13. The semiconductor structure according to claim 3, wherein the insulation layer is formed of silicon dioxide.

14. The semiconductor structure according claim 8, further comprising a carrier plate on which the handle disc is arranged.

15. The semiconductor structure according claim 14, wherein a conductive fixing layer is provided which is extended across the buried insulation layer and is in contact with the active disc.

16. The semiconductor structure according to claim 14, wherein the carrier plate of a housing is electrically connected from a front side.

17. The semiconductor structure according to claim 15, wherein the fixing layer is in contact with the doped, buried layer.

18. The semiconductor structure according to claim 12, wherein the insulation trench is substantially at least 50μm deep.

19. A method for producing a handle disc contact in a trench insulated SOI disc, comprising the steps
- producing an insulation trench formed at an edge of a chip area of an active disc of the SOI disc, the insulation trench extending to the buried insulation layer and comprising a side wall area, wherein at least at a side of the insulation trench faces away from the chip area and has a same conductivity type as the active disc of the SOI disc and is electrically connected therewith;
- producing a doped contact region being in contact with the doped sidewall area;
- singularization of the chip area by sawing along a sawing edge whereby the buried insulation layer is disturbed at its surface with respect to crystallography thereby producing a high-ohmic, conductive connection between the handling disc and the active disc.

20. The method according to claim 19, further comprising producing a metallization connection that is connected to the doped contact region.

21. The method according to claim 19, wherein the doped contact region is produced during the implantation of a drain and source areas in the chip area.

22. The method according to claim 19, wherein a connection between the doped contact region and a bond pad is produced during metallization.

23. The method according to claim 19, further comprising creating a connection to a circuit in the chip area for controlling the doped contact region during metallization.

24. The method according to claim 19, wherein the singularized chip area is fixed to a carrier plate by a conductive fixing layer after the singularization, wherein the carrier plate forms a conductive, low-ohmic connection between the handling disc and the active disc across the buried insulation layer.

25. The method according to claim 19, further comprising providing a doped, buried layer in the active area of the buried insulation layer that is in connection with the doped sidewall area of the insulation trench.

26. The method according to claim 19, wherein a level of doping is at least $10^{16}$ per $cm^3$ in the doped sidewall area.

27. The method according to claim 19, wherein a level of doping is at least $10^{18}$ per $cm^3$ in the doped contact region.

28. The method according to claim 19, wherein a level of doping is at least $10^{17}$ per $cm^3$ in the doped buried layer.

29. The method according to claim 25, wherein the connection is affected in the plane of the doped, buried layer or generated there.

* * * * *